United States Patent [19]

Hosoba et al.

[11] Patent Number: 5,206,185
[45] Date of Patent: Apr. 27, 1993

[54] SEMICONDUCTOR LASER DEVICE

[75] Inventors: Hiroyuki Hosoba, Tenri; Mitsuhiro Matsumoto, Nara; Sadayoshi Matsui, Tenri; Taiji Morimoto, Nara, all of Japan

[73] Assignee: Sharp Kabushiki Kaisha, Osaka, Japan

[21] Appl. No.: 707,449

[22] Filed: May 30, 1991

Related U.S. Application Data

[62] Division of Ser. No. 455,574, Dec. 22, 1989, Pat. No. 5,054,031.

[30] Foreign Application Priority Data

Dec. 29, 1988 [JP] Japan ................. 63-334138

[51] Int. Cl.⁵ .................. H01L 21/20; H01L 21/208
[52] U.S. Cl. ........................ 437/129; 437/130
[58] Field of Search .................. 437/129, 130; 148/DIG. 95; 372/45, 46, 48, 50; 357/18

[56] References Cited

U.S. PATENT DOCUMENTS

| 4,694,459 | 12/1987 | Burnham ................. 372/46 |
| 4,792,959 | 12/1988 | Mueller et al. ........... 372/46 |
| 4,819,245 | 4/1989 | Morimoto et al. ......... 372/48 |
| 4,878,223 | 11/1989 | Morimoto et al. ......... 472/40 |
| 4,903,274 | 2/1990 | Taneya et al. ............ 372/46 |

FOREIGN PATENT DOCUMENTS

| 0199588 | 10/1986 | European Pat. Off. ...... 372/48 |
| 60-037190 | 2/1985 | Japan ................... 372/46 |
| 62-015879 | 1/1987 | Japan ................... 372/50 |
| 62-97384 | 5/1987 | Japan . |
| 62-283685 | 12/1987 | Japan ................... 437/129 |

OTHER PUBLICATIONS

Matsubara et al., *Mitsubishi Electronics Technology Journal* (1988) 62(7):566–569.
Iwamoto, Patent Abstracts of Japan (Jul. 15, 1986) vol. 10, No. 201, (E-419) (2257).
Murakami et al., *Electronics Letters* (Feb. 13, 1986) 22(4):217–218.

*Primary Examiner*—Olik Chaudhuri
*Assistant Examiner*—Loc Q. Trinh
*Attorney, Agent, or Firm*—Morrison & Foerster

[57] ABSTRACT

A semiconductor laser device is disclosed which comprises a semiconductor substrate having a ridge portion, the width of the ridge portion being smaller in the vicinity of the facets than in the inside of the device; a current blocking layer formed on the substrate including the ridge portion; at least one striped groove formed on the center of the ridge portion through the current blocking layer; and a multi-layered structure disposed on the current blocking layer, the multi-layered structure successively having a first current blocking layer, an active layer for laser oscillation, and a second current blocking layer; wherein at least two side grooves are symmetrically formed on both sides of the center region of the ridge portion with the same width as that of the regions thereof near the facets. Also, disclosed is a method for producing the semiconductor laser device.

2 Claims, 5 Drawing Sheets

SEMICONDUCTOR LASER DEVICE

This application is a division of application Ser. No. 07/455,574 filed, Dec. 22, 1989, now U.S. Pat. No. 5,054,031.

BACKGROUND OF THE INVENTION

1. Field of the Invention

This invention relates to a high-power semiconductor laser device in which the density of laser light within the active layer is reduced in the vicinity of the cavity facets.

2. Description of the Prior Art

In recent years, semiconductor laser devices have been widely used as a light source for optical disk players and optical communication systems. The semiconductor laser devices used for these applications are required to emit laser light with high output power. However, the output power of semiconductor laser devices which have been put to practical use is only as high as 50 mW. One possible reason that high output power cannot be attained is deterioration of crystals at the cavity facets. To reduce the crystal deterioration, liquid phase epitaxy (LPE) is used to make the thickness of an active layer smaller in the vicinity of the facets than in the inside of the device, thereby reducing the density of laser light within the active layer in the vicinity of the facets.

FIG. 5c shows a conventional semiconductor laser device with a $T^3$ structure which is well known as a device of this type (see, e.g., Technical Report of Mitsubishi Denki Co., Ltd., Vol. 62, No. 7, 14(566), 1988). FIG. 5d is a top plan view showing the semiconductor laser device, in which a ridge configuration is indicated by broken lines. FIGS. 5a and 5b are perspective views showing the production of the semiconductor laser device.

The semiconductor laser device of FIG. 5c is produced as follows: On the plane of a p-GaAs substrate 21, a ridge portion 32 with a height of 2 μm is formed by an etching technique. The width of the ridge portion 32 is small in the vicinity of the facets and great in the inside of the device, as shown in FIG. 5a. Then, on the entire surface of the substrate 21 including the ridge portion 32, an n-GaAs current blocking layer 22 is formed by an epitaxial growth method and on the center of the ridge portion 32, a V-striped groove 31 is formed through the current blocking layer 22 by an etching technique, as shown in FIG. 5b. Moreover, on the entire surface of the current blocking layer 22 including the V-striped groove 31, a p-AlGaAs first cladding layer 23 an AlGaAs active layer 24, an n-AlGaAs second cladding layer 25, and an n-GaAs cap layer 26 are successively grown by liquid phase epitaxy, resulting in a double-heterostructure shown in FIG. 5c.

In cases where crystal growth on the substrate having the ridge portion is conducted by liquid phase epitaxy as described above, the crystal growth is promoted on the side faces of the ridge portion, whereas the crystal growth is suppressed on the upper face of the ridge portion. This phenomenon is well known as an anisotropy of crystal growth and this property causes a significantly thinner crystal film to be grown on the upper face than on the side faces of the ridge portion.

With the use of the anisotropy of crystal growth, the thickness of a layer formed on the ridge portion can be controlled by a change in the width of the ridge portion. That is, the grown layer becomes thick in the wide region but becomes thin in the narrow region of the ridge portion. Therefore, when several layers including the active layer 24 are formed on the ridge portion 32 of a configuration shown in FIG. 5a by liquid phase epitaxy, the active layer 24 becomes thin in the vicinity of the facets but becomes thick in the inside of the device. In the $T^3$ type semiconductor laser device produced in such a manner, because the active layer 24 is thin in the vicinity of the facets, part of laser light enters into the first cladding layer 23 and the second cladding layer 25 in the vicinity of the facets, thereby reducing the density of the laser light within the active layer 24. Thus, optical output power at the limit of destruction can be improved to attain high-power operation.

In the $T^3$ type semiconductor laser device as produced above, the first cladding layer 23 should be grown prior to the growth of the active layer 24 and serious problems arise therefrom.

The first cladding layer 23 is thin in the vicinity of the facets and thick in the inside of the device because of the growth by liquid phase epitaxy. Such a difference in the thickness of the first cladding layer 23 is not preferred, because the thickness of the first cladding layer 23 should be set at a value suitable for the formation of an appropriate index guiding mechanism.

The active layer 24 is not also flat and has irregularities as large as 0.2 μm, because it is formed on the uneven first cladding layer 23 by liquid phase epitaxy. This situation is shown in a sectional view of FIG. 6, which is taken at line VI—VI of FIG. 5d. Thus, the irregularities of the active layer 24 cause the occurrence of sub-peaks in the vertical direction of the far field pattern of emitted light, resulting in a deterioration of the device characteristics.

SUMMARY OF THE INVENTION

The semiconductor laser device of this invention, which overcomes the above-discussed and numerous other disadvantages and deficiencies of the prior art, comprises a semiconductor substrate having a ridge portion, the width of the ridge portion being smaller in the vicinity of the facets than in the inside of the device; a current blocking layer formed on the substrate including the ridge portion; at least one striped groove formed on the center of the ridge portion through the current blocking layer; and a multi-layered structure disposed on the current blocking layer, the multi-layered structure successively having a first current blocking layer, an active layer for laser oscillation, and a second current blocking layer; wherein at least two side grooves are symmetrically formed on both sides of the center region of the ridge portion with the same width as that of the regions thereof near the facets.

In a preferred embodiment, the upper face of the first cladding layer is substantially flat.

In a preferred embodiment, the thickness of the active layer is smaller in the vicinity of the facets than in the inside of the device.

In a preferred embodiment, the multi-layered structure is formed by liquid phase epitaxy.

The method for producing a semiconductor laser device of this invention, comprises the steps of: forming a ridge portion on a semiconductor substrate; forming at least two side grooves symmetrically on both sides of the center region of the ridge portion with the same width as that of the regions thereof near the facets; growing a current blocking layer on the entire surface of the substrate including the ridge portion; forming at least one striped groove on the center of the ridge portion through the current blocking layer; and forming a multi-layered structure on the current blocking layer, the multi-layered structure having an active region for laser oscillation.

In a preferred embodiment, the multi-layered structure is formed by liquid phase epitaxy.

Thus, the invention described herein makes possible the objectives of (1) providing a semiconductor laser device which can attain laser oscillation of high output power without degrading the device characteristics; and (2) providing a method for producing such a semiconductor laser device with excellent reproducibility.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The semiconductor laser device of this invention is produced on a semiconductor substrate having a ridge portion. The width of the ridge portion is smaller in the vicinity of the facets than in the inside of the device. The ridge portion is provided with at least two symmetric side grooves on both sides of the center region thereof. This constitution makes it possible to grow semiconductor layers (e.g., a current blocking layer and a first cladding layer) so as to have a substantially flat surface above the ridge portion. That is, during the formation of the first cladding layer, the side grooves are substantially buried in the first current blocking layer, so that the upper face of the first cladding layer is substantially flat. Thus, an active layer can be grown without irregularities on the first cladding layer such that the thickness of the active layer is smaller in the vicinity of the facets than in the inside of the device. For this reason, the semiconductor laser device can attain laser oscillation of high output power without degrading the device characteristics.

EXAMPLES

Figure 1:
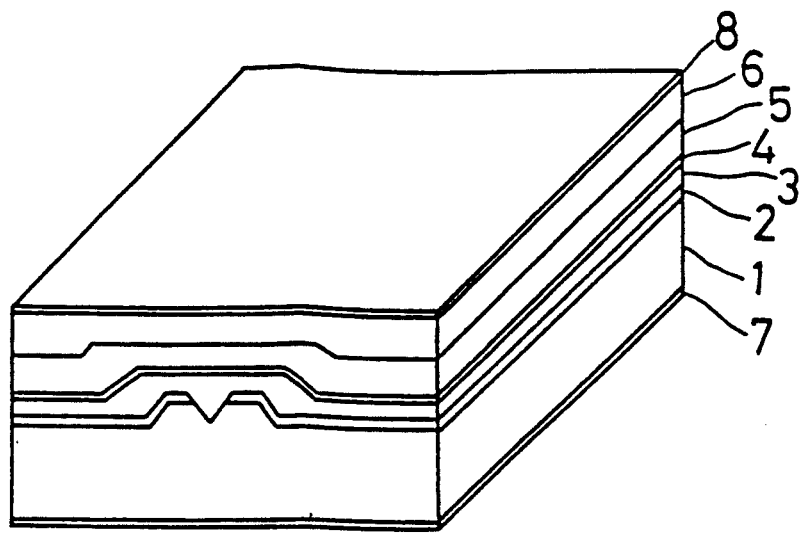
FIG. 1 is a perspective view showing a semiconductor laser device of this invention.

FIG. 1 shows a semiconductor laser device of this invention. This semiconductor laser device was produced as shown in FIGS. 2a to 2e. The following describes the production of the semiconductor laser device by reference to these figures.

Figure 2A:
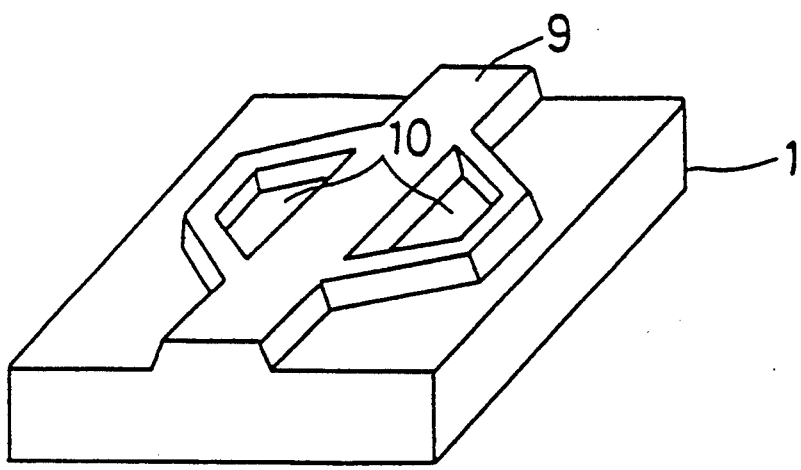
FIGS. 2a to 2e are perspective views showing the production of the semiconductor laser device of FIG. 1.

On the plane of a p-GaAs substrate 1, a ridge portion 9 with a height of 2 μm was formed by an etching technique. The ridge portion 9 has an uneven configuration, the width of which is 20 μm in the regions near the facets and 50 μm in the center region of the substrate 1. Between these two regions, the width of the ridge portion 9 changes gradually from 20 μm to 50 μm. Moreover, the ridge portion 9 was provided with two symmetric side grooves 10 on both sides of the center region with the same width as that of the regions near the facets, as shown in FIG. 2a. The cavity length of a resonator is 250 μm. The two regions with a width of 20 μm in the vicinity of the facets have a length of 40 μm in the resonating direction, respectively; the two regions with a width changed gradually have a length of 40 μm, respectively; and the center region of the resonator, with a width of 50 μm, has a length of 90 μm.

Figure 2B:
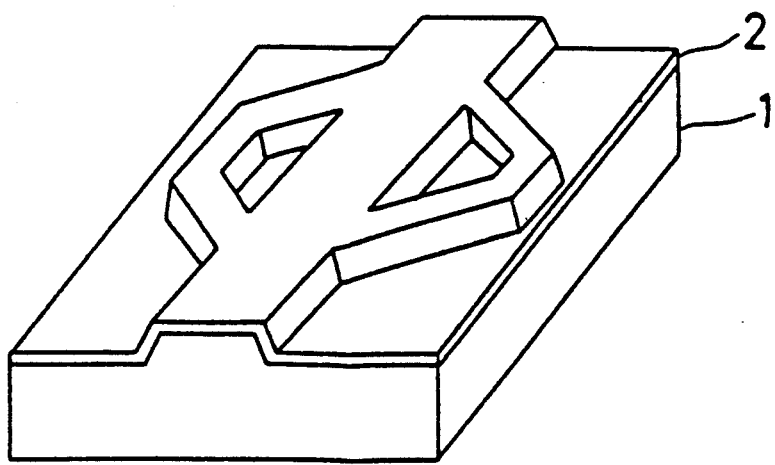

Then, on the entire surface of the p-GaAs substrate 1 including the ridge portion 9, an n-GaAs current blocking layer 2 was formed by liquid phase epitaxy as shown in FIG. 2b. Because the width of the ridge portion 9 in the regions near the facets is the same as that of the ridge portion 9 in the center region interposed between the side grooves 10, the current blocking layer 2 can be formed to have an even thickness (e.g., 0.8 μm in this example) both in the regions near the facets and in the center region. Even after the formation of the current blocking layer 2, the side grooves 10 remained partially unfilled. Alternatively, metal-organic chemical vapor deposition can be used for the growth of the current blocking layer 2 of the same configuration.

Figure 2C:
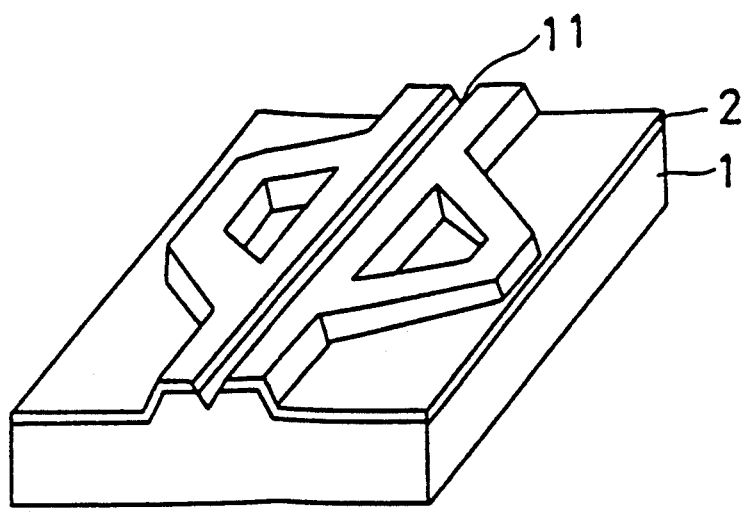
Figure 2D:
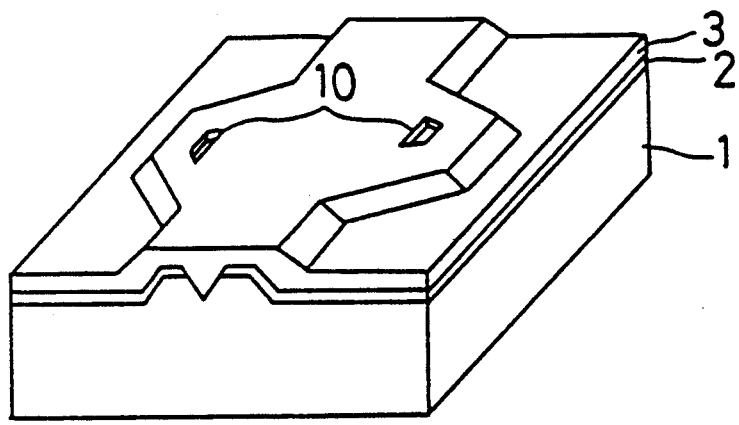

Then, on the center of the ridge portion 9, a V-striped groove 11 is formed to reach the p-GaAs substrate 1 through the current blocking layer 2, as shown in FIG. 2c, by an etching technique. The V-striped groove 11 makes it possible to confine a current to be injected into an active region. Thereafter, on the entire surface, a p-GaAlAs first cladding layer 3 is grown by liquid phase epitaxy as shown in FIG. 2d. The p-GaAlAs first cladding layer 3 also has an even thickness (e.g., 0.3 μm in this example) both in the regions near the facets and in the center region because of the presence of the side grooves 10. During the formation of the p-GaAlAs first cladding layer 3, the side grooves 10 were entirely or substantially buried in the p-GaAlAs first cladding layer 3, on which GaAlAs active layer 4 was then formed by liquid phase epitaxy. In an early stage of the growth of the GaAlAs active layer 4, the side grooves 10 were entirely buried therein, so that the GaAlAs active layer 4 was thick in the center region and thin in the regions near the facets. In this example, the thickness of the GaAlAs active layer 4 on the V-striped groove 11 was 0.08 μm in the center region and 0.03 μm in the regions near the facets.

Figure 2E:
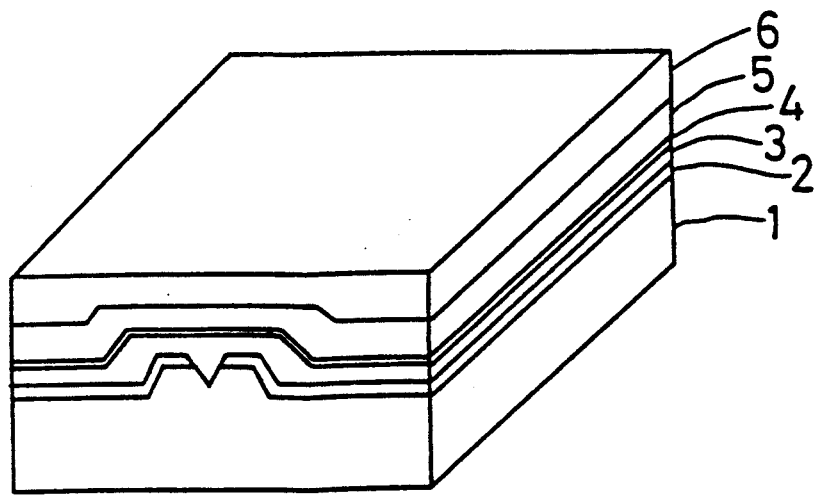

Next, on the surface of the GaAlAs active layer 4, an n-GaAlAs second cladding layer 5 and an n-GaAs contact layer 6 were successively grown as shown in FIG. 2e. Finally, on the back face of the p-GaAs substrate 1 and the upper face of the n-GaAs contact layer 6, a p-sided electrode 7 and an n-sided electrode 8 were formed, resulting in a semiconductor laser device as shown in FIG. 1.

The semiconductor laser device of this example attained continuous laser oscillation with the maximum optical output power of 300 mW at room temperature. Moreover, the semiconductor laser device operated stably for the long period of 3,000 hours or more under the output power of 100 mW at 50° C., indicating high reliability of the device. During the above-mentioned operation, the laser oscillation stably continued in the fundamental traverse mode and the far field pattern was stabilized against a change in the optical output power. The spread angle of laser beams emitted from the device was about 10 degrees in a direction parallel to the semiconductor layers of the device and about 20 degrees in the direction at right angles thereto (wherein the spread angle is expressed in terms of a full angle at half maximum). Thus, the ratio of an angle in the vertical direction to an angle in the horizontal direction is small, thereby attaining high coupling efficiency to an external optical system.

Figure 3A:
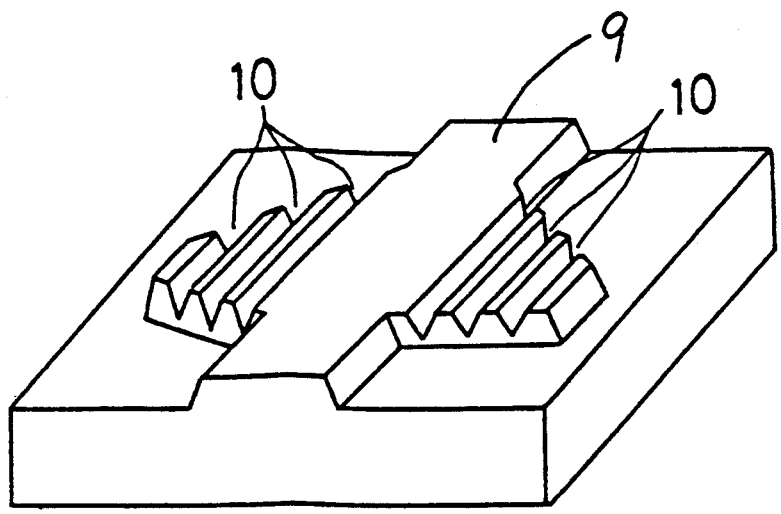
FIG. 3a is a perspective view showing a substrate for another semiconductor laser device of this invention, wherein the substrate is provided with a ridge portion having side grooves.
Figure 3B:
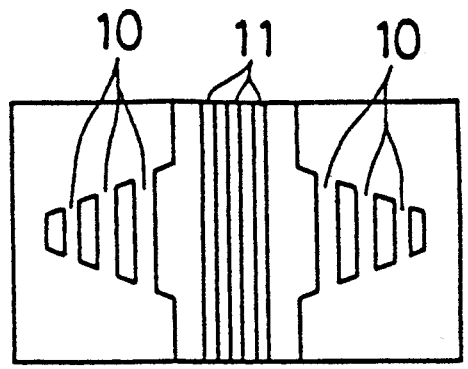
FIG. 3b is a top plan view showing the substrate of FIG. 3a, wherein a current blocking layer is grown on the entire surface of the substrate and then three V-striped grooves are formed on the center of the ridge portion.

In the same manner as mentioned above another semiconductor laser device of this invention ridge portion 9 having side grooves 10 as shown in FIG. 3a, and after the growth of a current blocking layer thereon, three V-striped grooves 11 were formed on the ridge portion as shown in FIG. 3b.

Figure 4A:
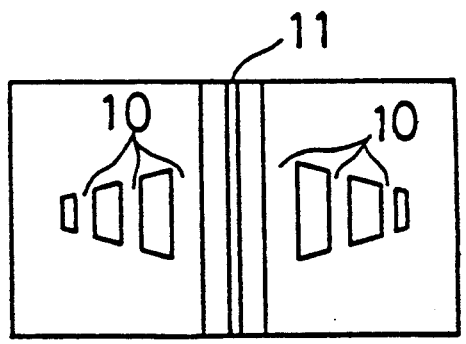
FIGS. 4a and 4b are top plan views showing different substrates for other semiconductor laser devices of this invention, wherein each of the substrates is provided with a ridge portion having side grooves and then a current blocking layer is grown on the entire surface thereof, after which a V-striped groove is formed on the center of the ridge portion.
Figure 4B:
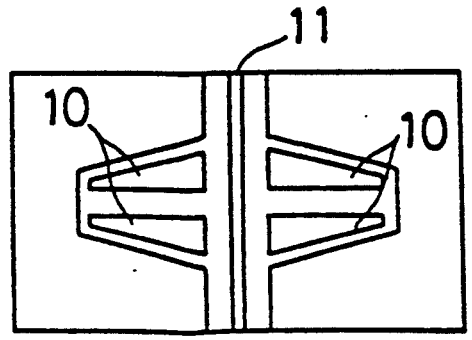
Figure 5A:
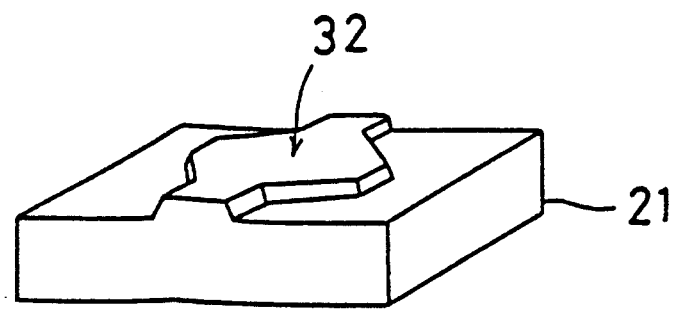
FIGS. 5a to 5c are perspective views showing the production of a conventional $T^3$ type semiconductor laser device.
Figure 5B:
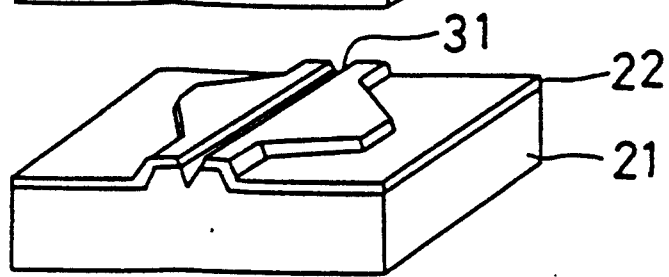
Figure 5C:
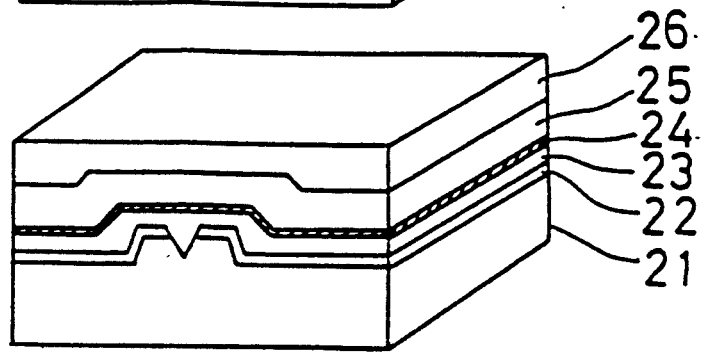
Figure 5D:
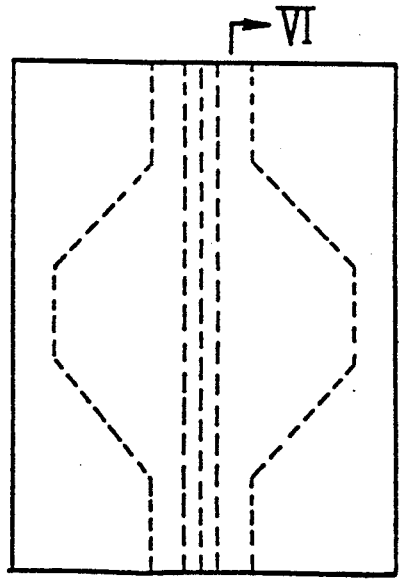
FIG. 5d is a top plan view showing the semiconductor laser device of FIGS. 5a to 5c.
Figure 6:
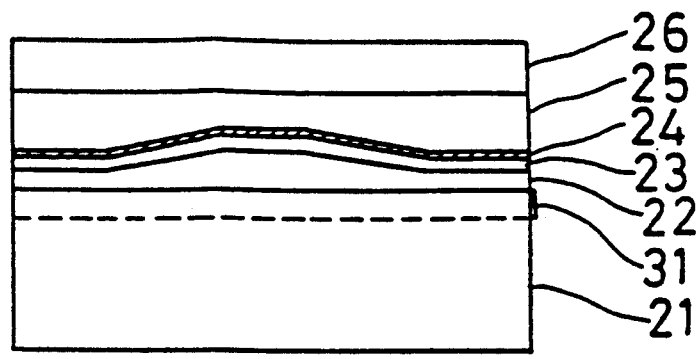
FIG. 6 is a sectional view taken at line VI—VI of FIG. 5d.

FIGS. 4a and 4b show different substrates for other semiconductor laser devices of this invention, wherein each of the substrates was provided with a ridge portion 9 having side grooves 10 and then a current blocking layer was grown on the entire surface thereof, after which a V-striped groove 11 was formed on the center of the ridge portion. With the use of these substrates, semiconductor laser devices were produced in the same manner as mentioned above.

The semiconductor laser devices produced from the substrates shown in FIGS. 3b, 4a, and 4b, respectively, attained excellent device characteristics similar to those of the semiconductor laser device shown in FIG. 1.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for producing a semiconductor laser device, comprising the steps of: forming a ridge portion on a semiconductor substrate, the width of said ridge portion being smaller in the vicinity of the facets than in the inside of the device; forming at least three V-striped side grooves symmetrically on both sides of the center region of said ridge portion with the same width as that of the regions thereof near the facets, respectively; growing a current blocking layer on the entire surface of said substrate including the ridge portion; forming at least one striped groove for an optical waveguide on the center of said ridge portion through the current blocking layer; and forming a multi-layered structure on said current blocking layer, said multi-layered structure having an active region for laser oscillation.

2. A method for producing a semiconductor laser device according to claim 1, wherein said multi-layered structure is formed by liquid phase epitaxy.

* * * * *